(12) United States Patent  
Itoh

(10) Patent No.: US 8,771,905 B2  
(45) Date of Patent: Jul. 8, 2014

(54) EXPOSURE MASK AND METHOD FOR MANUFACTURING SAME AND METHOD FOR MANUFACTURING SEMICONDUCTOR DEVICE

(75) Inventor: Masamitsu Itoh, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 92 days.

(21) Appl. No.: 13/491,641

(22) Filed: Jun. 8, 2012

(65) Prior Publication Data

US 2012/0244714 A1 Sep. 27, 2012

Related U.S. Application Data

(62) Division of application No. 12/700,457, filed on Feb. 4, 2010, now Pat. No. 8,216,744.

(30) Foreign Application Priority Data

Feb. 6, 2009 (JP) .................................. 2009-025594

(51) Int. Cl.
*G03F 1/40* (2012.01)
(52) U.S. Cl.
USPC ............................................................ 430/5

(58) Field of Classification Search
USPC ................ 430/5, 322, 323, 324, 394; 378/35; 428/428, 430
See application file for complete search history.

(56) References Cited

U.S. PATENT DOCUMENTS

| 6,921,613 | B2 | 7/2005 | Enloe |
| 2006/0115744 | A1 | 6/2006 | Aschke et al. |
| 2008/0311486 | A1 | 12/2008 | Itoh |
| 2009/0317732 | A1 | 12/2009 | Itoh et al. |
| 2010/0021826 | A1 | 1/2010 | Inanami et al. |

FOREIGN PATENT DOCUMENTS

JP 2007-273651 10/2007

*Primary Examiner* — Stephen Rosasco
(74) *Attorney, Agent, or Firm* — Finnegan, Henderson, Farabow, Garrett & Dunner, L.L.P.

(57) ABSTRACT

An exposure mask includes: an insulative substrate; a light reflecting film provided on the substrate; a light absorbing film provided on the light reflecting film and forming a pattern in a center region on the substrate; and an interconnect provided on the substrate, the light reflecting film and the light absorbing film not being provided in a frame-shaped region surrounding the center region, and the interconnect being placed so that a portion of a laminated film composed of the light reflecting film and the light absorbing film located inside the frame-shaped region is electrically connected to a portion of the laminated film located outside the frame-shaped region.

3 Claims, 7 Drawing Sheets

EXPOSURE MASK AND METHOD FOR MANUFACTURING SAME AND METHOD FOR MANUFACTURING SEMICONDUCTOR DEVICE

CROSS-REFERENCE TO RELATED APPLICATIONS

This is a division of application Ser. No. 12/700,457, filed Feb. 4, 2010 now U.S. Pat. No. 8,216,744, which is incorporated herein by reference.

This application is based upon and claims the benefit of priority from the prior Japanese Patent Application No. 2009-25594, filed on Feb. 6, 2009; the entire contents of which are incorporated herein by reference.

BACKGROUND OF THE INVENTION

1. Field of the Invention

This invention relates to a reflection-type exposure mask and a method for manufacturing the same and a method for manufacturing a semiconductor device using this exposure mask.

2. Background Art

In the manufacturing process for semiconductor devices, the demands for the miniaturization of photolithography are increased with the downscaling of semiconductor devices. The device design rule has already been reduced to 24 nm (nanometers). Also with regard to light exposure for lithography, conventional exposure using ArF excimer laser light with a wavelength of 193 nm is being replaced by exposure using EUV (extreme ultraviolet) light with a wavelength of 13.5 nm.

Most substances have high optical absorption for EUV light. Hence, the EUV exposure mask (EUV mask) is a reflection-type mask unlike the conventional transmission-type masks. For instance, JP-A 2007-273651 (Kokai) discloses a technique for forming a light reflecting film made of a multilayer film by alternately laminating molybdenum (Mo) layers and silicon (Si) layers on a glass substrate, and forming a pattern thereon from a light absorber primarily composed of tantalum (Ta).

In addition, a halftone (HT) type is becoming the mainstream EUV mask in recent years. In conventional EUV masks, which are not of the HT type, the light absorber has a thickness of approximately 90 nm, and its EUV reflectance is nearly zero. In contrast, in HT-type EUV masks, the light absorber is as thin as approximately 50 nm, and its EUV reflectance is 2-3%. Furthermore, EUV light transmitted in the light absorber and reflected by the light reflecting film is approximately 180 degrees out of phase with respect to EUV light directly reflected by the light reflecting film without being transmitted in the light absorber. This increases contrast on the wafer and improves edge roughness of the exposed and developed resist pattern.

However, in a HT-type EUV mask, EUV light incident on the light absorber is also reflected. Hence, when a certain exposure region of a wafer is light-exposed, the EUV light undesirably leaks into an exposure region adjacent to this exposure region. In this context, a technique for preventing this leakage of EUV light has been developed, in which the light reflecting film is removed in a frame-shaped region surrounding a center region of the EUV mask where the light absorber is patterned. In this frame-shaped region from which the light reflecting film is removed, the glass substrate is exposed and scarcely reflects the incident EUV light. Hence, leakage of EUV light into the adjacent exposure region can be prevented.

On the other hand, defect inspection for an EUV mask is performed by irradiation with an electron beam from a scanning electron microscope (SEM) or the like. During the inspection, a conductive pin is brought into contact with a peripheral region of the EUV mask to release irradiated electrons. This can avoid charge-up of the EUV mask, and a clear image can be obtained for the inspection.

However, if the light reflecting film or the like is removed from the EUV mask in a frame-shaped region, the portion of the light reflecting film and the light absorber located inside the frame-shaped region is electrically insulated from the portion located outside the frame-shaped region. The pattern to be inspected is formed in the portion inside the frame-shaped region, whereas the conductive pin is brought into contact with the portion outside the frame-shaped region. Hence, the patterned portion is placed in an electrically floating state. If the patterned portion is irradiated with an electron beam for defect inspection, charge-up causes image distortion and hinders accurate defect inspection. Hence, some defects are missed in defect inspection, and an EUV mask containing these defects is erroneously determined to be non-defective. Consequently, in the manufacturing stage of a semiconductor device, these defects are transferred to the semiconductor device and decrease the manufacturing yield of the semiconductor device.

SUMMARY OF THE INVENTION

According to an aspect of the invention, there is provided an exposure mask including: an insulative substrate; a light reflecting film provided on the substrate; a light absorbing film provided on the light reflecting film and forming a pattern in a center region on the substrate; and an interconnect provided on the substrate, the light reflecting film and the light absorbing film not being provided in a frame-shaped region surrounding the center region, and the interconnect being placed so that a portion of a laminated film composed of the light reflecting film and the light absorbing film located inside the frame-shaped region is electrically connected to a portion of the laminated film located outside the frame-shaped region.

According to another aspect of the invention, there is provided a method for manufacturing an exposure mask, including: forming a pattern by selectively removing a light absorbing film in a center region of a mask blank that a light reflecting film is formed on an insulative substrate and the light absorbing film is formed on the light reflecting film, and removing the light absorbing film in a frame-shaped region surrounding the center region; removing the light reflecting film in the frame-shaped region; forming an interconnect on the substrate so that a portion of a laminated film composed of the light reflecting film and the light absorbing film located inside the frame-shaped region is connected to a portion of the laminated film located outside the frame-shaped region; and inspecting the pattern by irradiation with an electron beam.

According to still another aspect of the invention, there is provided a method for manufacturing a semiconductor device, including: forming a resist film on a semiconductor substrate; exposing the resist film using an exposure mask; developing the resist film to form a resist pattern; and using the resist pattern as a mask to selectively process the semiconductor substrate, the exposure mask including an insulative substrate, a light reflecting film provided on the substrate, a light absorbing film provided on the light reflecting film and forming a pattern in a center region on the substrate, and an interconnect provided on the substrate, the light reflecting film and the light absorbing film not being provided in a frame-shaped region surrounding the center region, and the interconnect being placed so that a portion of a laminated film composed of the light reflecting film and the light absorbing film located inside the frame-shaped region is electrically connected to a portion of the laminated film located outside the frame-shaped region.

DETAILED DESCRIPTION OF THE INVENTION

Embodiments of the invention will now be described with reference to the drawings.

At the outset, a first embodiment of the invention is described.

This embodiment relates to an exposure mask, and more particularly to a reflection-type halftone phase shift mask for use in EUV exposure. The wavelength of EUV light here is illustratively 13.5 nm.

Figure 1:
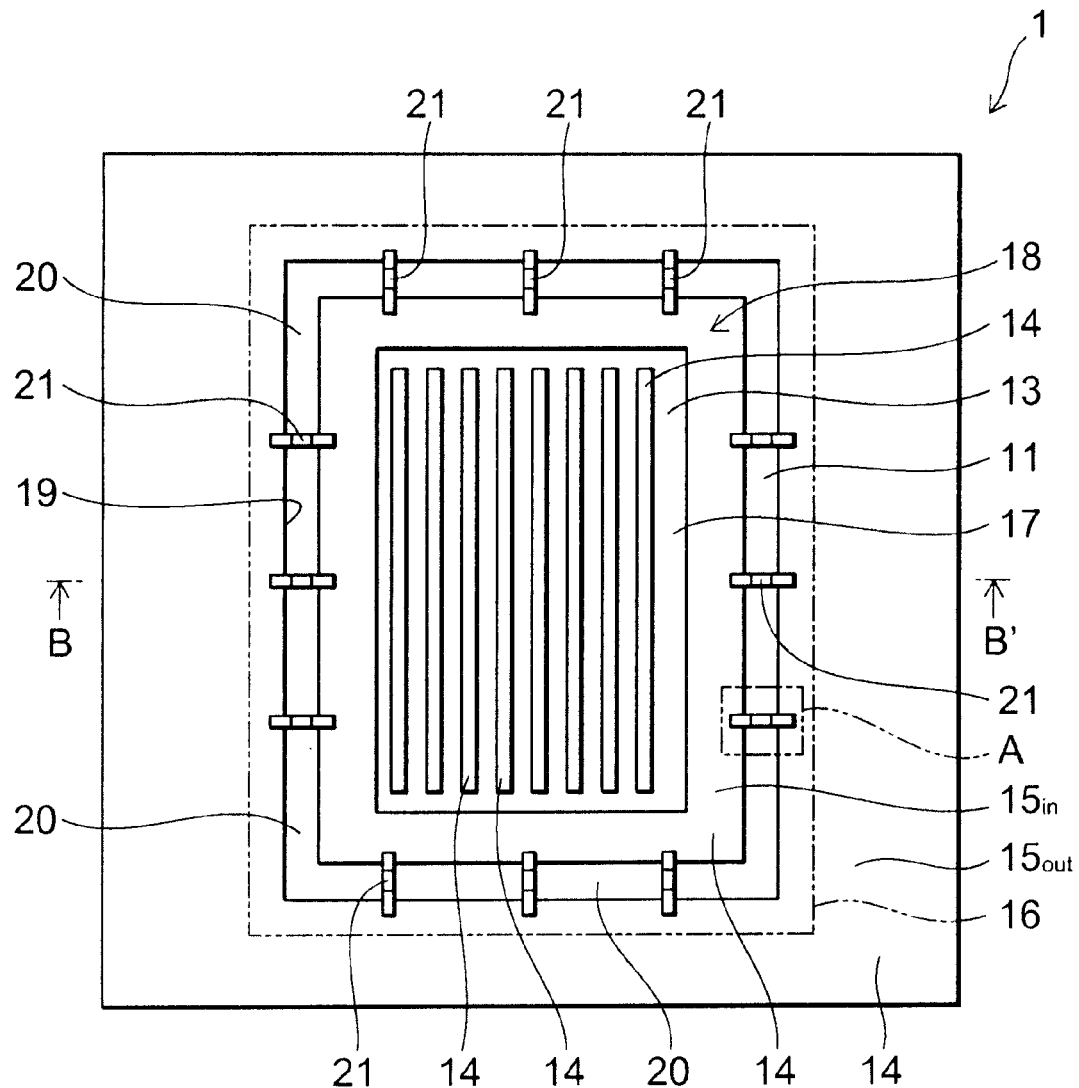
FIG. 1 is a plan view illustrating an exposure mask according to a first embodiment of the invention.

FIG. 1 is a plan view illustrating an exposure mask according to this embodiment.

Figure 2:
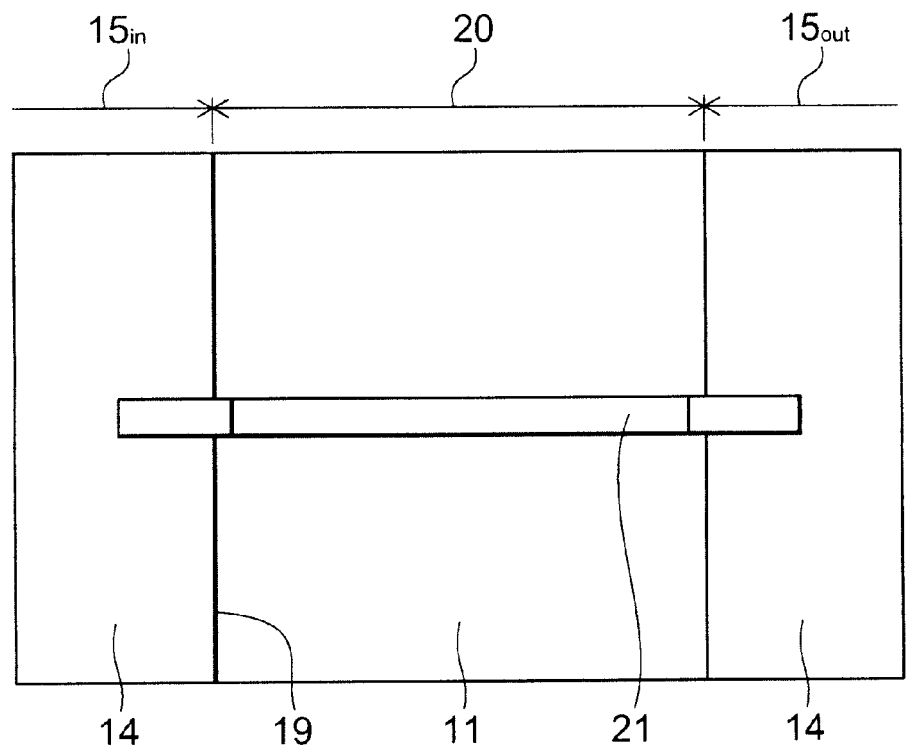
FIG. 2 is a partially enlarged plan view illustrating the region A of FIG. 1.

FIG. 2 is a partially enlarged plan view illustrating the region A of FIG. 1.

Figure 3:
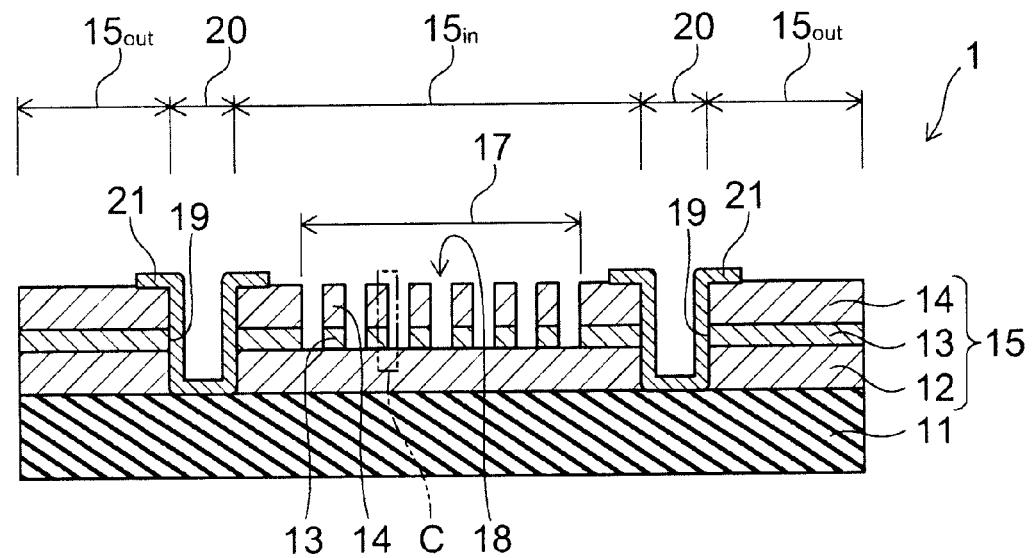
FIG. 3 is a cross-sectional view taken along line B-B' shown in FIG. 1.

FIG. 3 is a cross-sectional view taken along line B-B' shown in FIG. 1.

Figure 4:
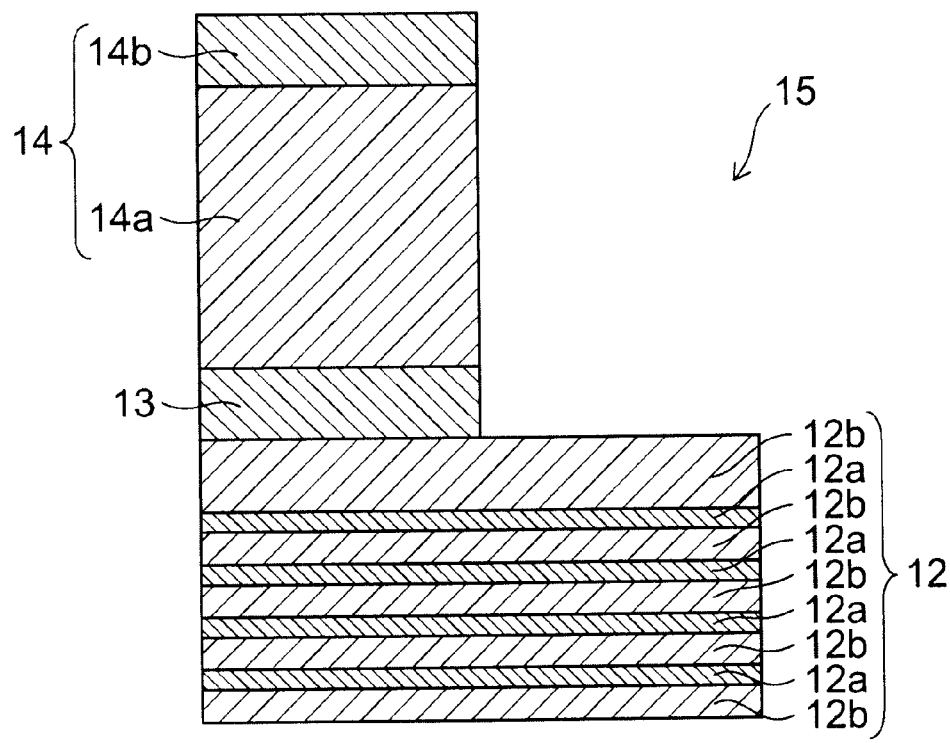
FIG. 4 is a partially enlarged cross-sectional view illustrating the region C of FIG. 3.

FIG. 4 is a partially enlarged cross-sectional view illustrating the region C of FIG. 3.

For convenience of illustration, the dimensional ratio of various portions and pattern configuration are different between the figures.

As shown in FIGS. 1 and 3, the exposure mask 1 according to this embodiment includes a substrate 11. The substrate 11 is formed from a low thermal expansion glass and is insulative. The thickness of the substrate 11 is illustratively 6.35 mm (millimeters).

A light reflecting film 12 is formed on the substrate 11. The light reflecting film 12 is a film reflecting at least part of incident EUV light, and is composed of a multilayer film. By way of example, as shown in FIG. 4, a molybdenum layer 12a having a thickness of 2.9 nm and a silicon layer 12b having a thickness of 4.0 nm are alternately laminated in 40 pairs in the light reflecting film 12. However, only the silicon layer 12b laminated at the top of the light reflecting film 12 has a thickness of 10 nm and serves as a capping layer. Thus, the total thickness of the light reflecting film 12 is e.g. approximately 280 nm.

A buffer layer 13 is formed on the light reflecting film 12. The buffer layer 13 serves to protect the light reflecting film 12 during repair of pattern defects. The buffer layer 13 is illustratively made of chromium nitride (CrN) and has a thickness of 10 nm.

A light absorbing film 14 is formed on the buffer layer 13. The light absorbing film 14 is a film absorbing at least part of the incident EUV light. By way of example, as shown in FIG. 4, the light absorbing film 14 includes a tantalum boron nitride (TaBN) layer 14a having a thickness of 40 nm, and a tantalum boron oxide (TaBO) layer 14b having a thickness of 11 nm is provided thereon. Thus, the total thickness of the light absorbing film 14 is illustratively 51 nm. The light reflecting film 12, the buffer layer 13, and the light absorbing film 14 form a laminated film 15. The laminated film 15 is electrically conductive.

As shown in FIG. 1, as viewed in the direction perpendicular to the upper surface of the substrate 11 (this direction being hereinafter referred to as "from above"), the outline of the exposure mask 1 is shaped like a rectangle, and illustratively a square measuring 152 mm on a side.

Furthermore, as viewed from above, an exposure region 16 is defined at the center of the exposure mask 1. The exposure region 16 is a maximum region in which an exposure pattern can be formed. The exposure region 16 is illustratively shaped like a rectangle with one side of 104 mm and the other of 132 mm.

The center region of the exposure region 16 is a patterning region 17. In the patterning region 17, the buffer layer 13 and the light absorbing film 14 are selectively removed to form a pattern 18. The minimum width of the pattern 18 is illustratively 96 nm. This is because the wavelength of EUV light used for exposure is 13.5 nm, the minimum width of the pattern transferred to a wafer (not shown) is 24 nm in terms of the half pitch, the pattern 18 of the exposure mask 1 is reduced by a factor of four and transferred to the wafer, and hence the minimum width of the pattern 18 is four times that of the pattern transferred to the wafer (24 nm×4=96 nm). In FIG. 1, for convenience of illustration, the pattern 18 has a line-and-space configuration. However, the configuration of the pattern 18 is not limited thereto.

No laminated film 15 is provided in a rectangular frame-shaped region lying outside the patterning region 17 (center region) in the exposure region 16 and surrounding the patterning region 17, but a trench 19 is formed therein. The substrate 11 is exposed to the bottom surface of the trench 19. In the following, the frame-shaped region where the trench 19 is formed and the substrate 11 is exposed is referred to as a "light shielding frame". The width of the light shielding frame 20 is illustratively 1 mm.

Furthermore, conductive interconnects 21 are provided across the light shielding frame 20 on the substrate 11. The interconnect 21 is provided on each side of the light shielding frame 20. For instance, three interconnects 21 for each side, twelve in total, are provided. The interconnect 21 is illustratively formed from a metal, such as chromium (Cr).

As shown in FIG. 2, one end portion of each interconnect 21 extends onto a portion $15_{in}$ of the laminated film 15 located inside the light shielding frame 20, the other end portion extends onto a portion $15_{out}$ of the laminated film 15 located outside the light shielding frame 20, and the portion between the one end portion and the other end portion is bent along the inner surface of the trench 19. Thus, each interconnect 21 is placed so as to connect the portion $15_{in}$ of the laminated film 15 to the portion $15_{out}$.

The width of the interconnect 21 is narrower than the minimum width of the pattern 18. Hence, when the EUV light reflected by the interconnect 21 reaches a wafer, the image of the interconnect 21 is not imaged and not transferred to the wafer. To ensure this effect, the width of the interconnect 21 is preferably less than or equal to half the minimum width of the pattern 18. As described above, in the case where the wavelength of EUV light used for exposure is 13.5 nm, for instance, the half pitch of the pattern transferred onto the wafer is approximately 24 nm, the minimum width of the pattern 18 is 96 nm, and hence the width of the interconnect 21 is preferably 48 nm or less. In addition, the half pitch of the pattern transferred onto the wafer can be reduced to approximately 18 nm by, for instance, increasing the numerical aperture of the optical system used for exposure. In this case, the minimum width of the pattern 18 is 72 nm (=18 nm×4), and hence the width of the interconnect 21 is preferably 36 nm or less. On the other hand, the thickness of the interconnect 21 is illustratively 10 to 100 nm, and more particularly 50 nm.

Next, the function and effect of this embodiment are described.

According to this embodiment, the interconnects 21 are formed across the light shielding frame 20. Thus, the portion $15_{in}$ of the laminated film 15 located inside the light shielding frame 20 is electrically connected to the portion $15_{out}$ located outside the light shielding frame 20 through the interconnects 21. Hence, when the pattern 18 is inspected by irradiating the patterning region 17 of the portion $15_{in}$ with an electron beam while grounding the portion $15_{out}$ through a conductive pin (not shown) in contact therewith, no charge-up occurs in the portion $15_{in}$ due to electron beam irradiation, enabling accurate inspection. Consequently, defect inspection can be accurately performed also after formation of the light shielding frame, and defects generated in the pattern 18 can be reliably detected and removed.

Furthermore, in this embodiment, the width of the interconnect 21 is narrower than the minimum width of the pattern 18. Hence, when the EUV light reflected by the interconnect 21 reaches a wafer, the width of the image of the interconnect 21 is smaller than the resolution of the EUV light, and not imaged on the wafer. Thus, the image of the interconnect 21 is not transferred to the wafer during light exposure of the wafer.

Moreover, in this embodiment, the interconnect 21 is provided on each side of the light shielding frame 20. Hence, charge-up of the portion $15_{in}$ can be prevented more reliably when the portion $15_{in}$ is irradiated with an electron beam.

Next, a variation of the first embodiment is described.

Figure 5:
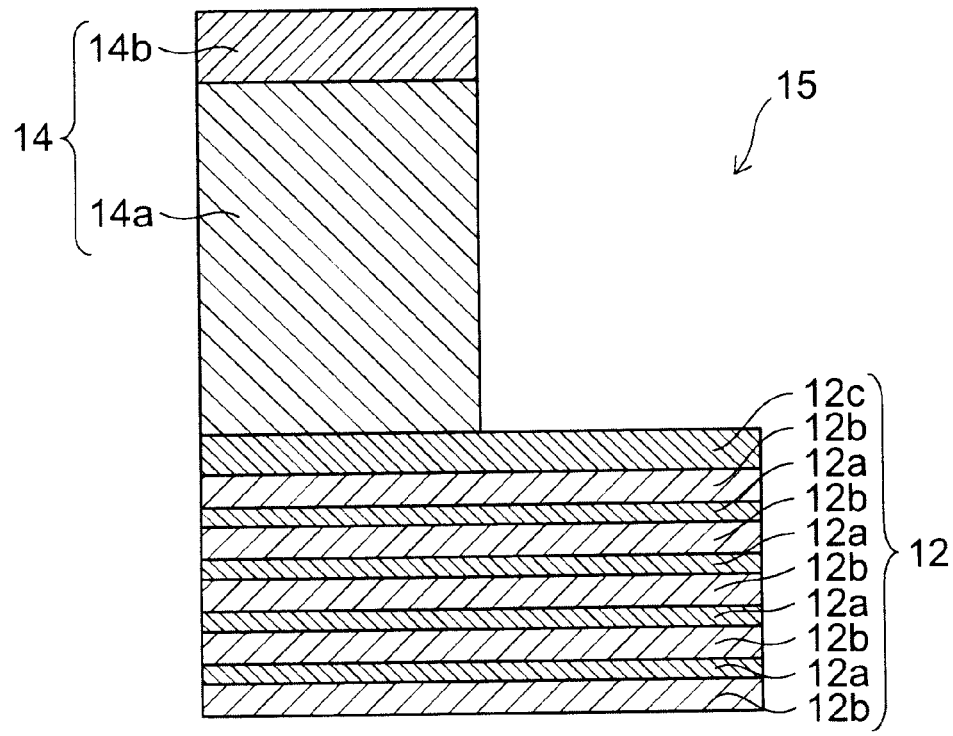
FIG. 5 is a partially enlarged cross-sectional view illustrating an exposure mask according to a variation of the first embodiment.

FIG. 5 is a partially enlarged cross-sectional view illustrating an exposure mask according to this variation.

The region shown by FIG. 5 corresponds to the region shown by FIG. 4 in the above first embodiment.

As shown in FIG. 5, the exposure mask according to this variation is different from the exposure mask 1 (see FIG. 4) according to the above first embodiment in the configuration of the laminated film 15. More specifically, in the exposure mask 2, a ruthenium (Ru) compound layer 12c having a thickness of 2.5 nm is provided as a capping layer at the top of the light reflecting film 12. The ruthenium compound layer 12c is formed with the compound of ruthenium and niobium, for example. Each of the plurality of silicon layers 12b constituting the light reflecting film 12 has an equal thickness. Furthermore, the exposure mask 2 includes no buffer layer 13 (see FIG. 4), but the tantalum boron nitride (TaBN) layer 14a is thickened by that amount. In this variation, the thickness of the tantalum boron nitride layer 14a is illustratively 51 nm.

As described below in the second embodiment, if any pattern defect occurs during the manufacturing of the exposure mask, this pattern defect is repaired by irradiation with a charged particle beam. In the above first embodiment, an electron beam or ion beam is used as the charged particle beam. However, the ion beam requires a buffer layer 13 because particles therein have a large momentum and damage the light reflecting film 12 if it is directly irradiated. In contrast, in this variation, an electron beam is used as the charged particle beam for repairing pattern defects. The electron beam does not damage the light reflecting film 12 even in direct irradiation, and hence the buffer layer can be omitted. Omission of the buffer layer can simplify the process for manufacturing the exposure mask and reduce the cost of the exposure mask. The configuration, function, and effect of this variation other than the foregoing are the same as those of the above first embodiment.

Next, a second embodiment of the invention is described.

This embodiment relates to a method for manufacturing an exposure mask.

Figure 6:
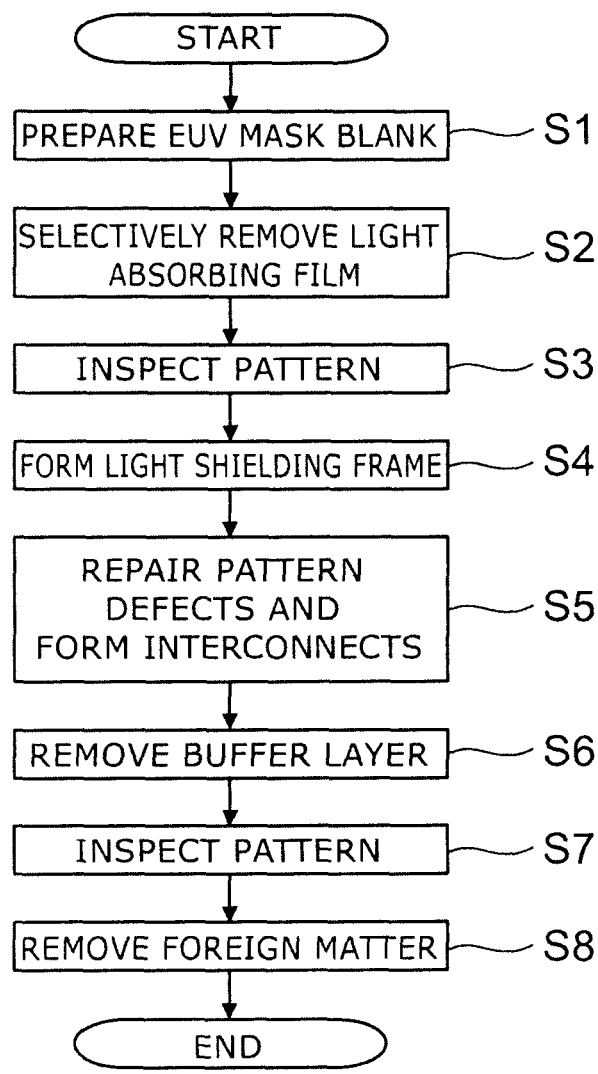
FIG. 6 is a flow chart illustrating a method for manufacturing an exposure mask according to a second embodiment of the invention.

FIG. 6 is a flow chart illustrating the method for manufacturing an exposure mask according to this embodiment.

FIGS. 7A to 7D are process cross-sectional views illustrating the method for manufacturing an exposure mask according to this embodiment.

In this embodiment, the exposure mask 1 according to the above first embodiment is manufactured.

Figure 7A:
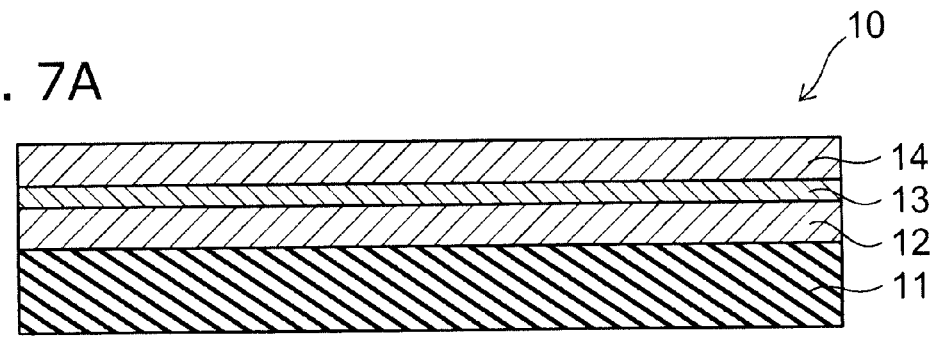
FIGS. 7A to 7D are process cross-sectional views illustrating the method for manufacturing an exposure mask according to the second embodiment of the invention.

First, as shown in step S1 of FIG. 6 and FIG. 7A, an EUV mask blank 10 is prepared. Typically, the EUV mask blank is purchased from a blanks manufacturer. As shown in FIGS. 7A and 4, the EUV mask blank 10 includes a substrate 11 made of a low thermal expansion glass. Entirely on this substrate 11, a molybdenum layer 12a having a thickness of 2.9 nm and a silicon layer 12b having a thickness of 4.0 nm are alternately laminated in 40 pairs. Here, only the uppermost silicon layer 12b has a thickness of 10 nm and serves as a capping layer. Thus, a light reflecting film 12 illustratively having a thickness of 280 nm is formed on the insulative substrate 11.

Furthermore, chromium nitride (CrN), for instance, is deposited to a thickness of 10 nm entirely on the light reflecting film 12 to form a buffer layer 13.

Furthermore, tantalum boron nitride (TaBN), for instance, is deposited to a thickness of 40 nm entirely on the buffer layer 13 to form a tantalum boron nitride layer 14a. Moreover, tantalum boron oxide (TaBO) is deposited to a thickness of 11 nm entirely on the tantalum boron nitride layer 14a to form a tantalum boron oxide layer 14b. Thus, a light absorbing film 14 having a thickness of 51 nm is formed. Moreover, the light absorbing film 14 is entirely coated with an electron beam resist (not shown). The EUV mask blank 10 is thus configured.

Figure 7B:
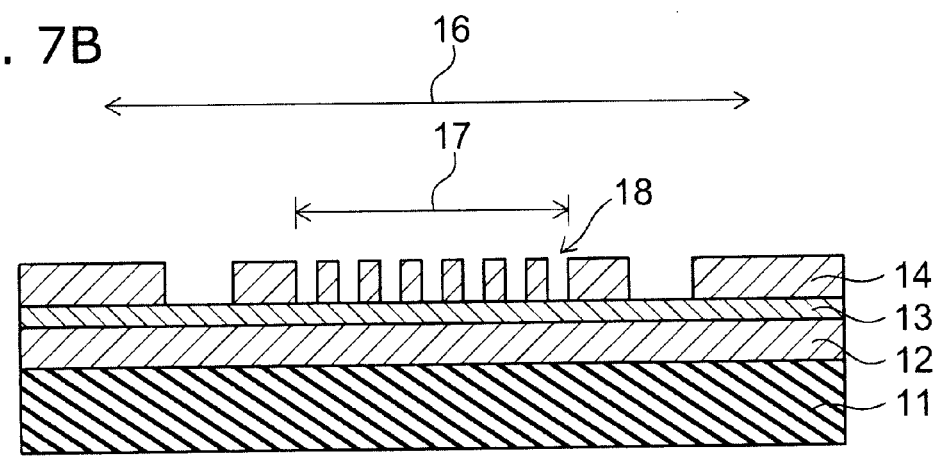

Next, as shown in step S2 and FIG. 7B, the light absorbing film 14 of the EUV mask blank 10 is selectively removed. More specifically, the electron beam resist is selectively irradiated with an electron beam to write a prescribed pattern on the electron beam resist. This pattern writing is performed illustratively by the electron beam writer, EBM-7000, manufactured by NuFlare Technology, Inc. Thus, a four-times magnified pattern of the half pitch (hp) 24-nm pattern to be formed on a wafer, that is, a pattern having a minimum width of 96 nm, is delineated inside a patterning region 17. Furthermore, a pattern corresponding to the light shielding frame 20 (see FIG. 1) is written inside an exposure region 16 and outside the patterning region 17. Subsequently, the electron beam resist is developed to form a resist pattern.

Then, this resist pattern is used as a mask to perform dry etching. Thus, the light absorbing film 14 is selectively removed in the patterning region 17 to form a pattern 18. Furthermore, the light absorbing film 14 is removed in the frame-shaped region surrounding the patterning region 17, that is, in the region where the light shielding frame 20 (see FIG. 3) is to be formed. Here, the buffer layer 13 is not etched but left on the entire surface. Subsequently, the electron beam resist is removed, and cleaning is performed. Thus, a precursor of the exposure mask 1 is fabricated.

Next, as shown in step S3, a first inspection is performed on the pattern 18. This inspection is performed by irradiating the patterning region 17 with an electron beam to obtain an electron image of the pattern 18, illustratively using the electron beam defect inspection system, EBeye-M, manufactured by Ebara Corp. Thus, defects generated in the pattern 18 are detected. Defects of a pattern include "pattern defects" and "foreign matter attachment". Pattern defects include black defects in which the light absorbing film 14 is left in the region where the light absorbing film 14 should be removed, and white defects in which the light absorbing film 14 is not left in the region where the light absorbing film 14 should be left. In this first inspection, the substrate 11 is entirely covered with the light reflecting film 12 and the buffer layer 13, which are conductive. Hence, no charge-up occurs due to electron beam irradiation.

Figure 7C:
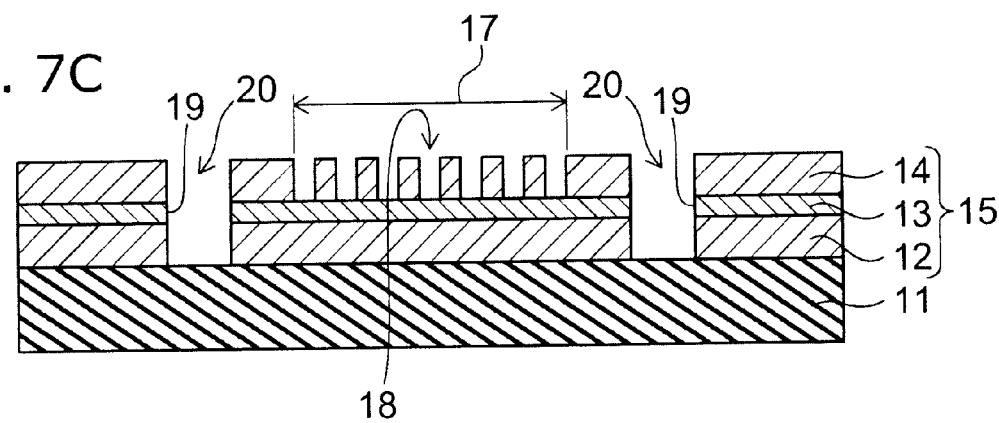

Next, as shown in step S4 of FIG. 6 and FIG. 7C, the precursor is entirely coated with an electron beam resist (not shown), and then selectively irradiated with an electron beam in alignment with the pattern 18 to write a pattern corresponding to the light shielding frame 20. This writing is performed illustratively by the electron beam writer, EBM-6000, manufactured by NuFlare Technology, Inc. Subsequently, the electron beam resist is developed to form an opening in a region where the light shielding frame 20 is to be formed. Then, this electron beam resist is used as a mask to perform etching to remove the buffer layer 13 and the light reflecting film 12 from the region where the light shielding frame 20 is to be formed. Thus, a trench 19 is formed in a laminated film 15 composed of the light reflecting film 12, the buffer layer 13, and the light absorbing film 14, and the substrate 11 is exposed to the bottom surface of the trench 19. Thus, a light shielding frame 20 scarcely reflecting incident EUV light is formed around the patterning region 17.

Figure 7D:
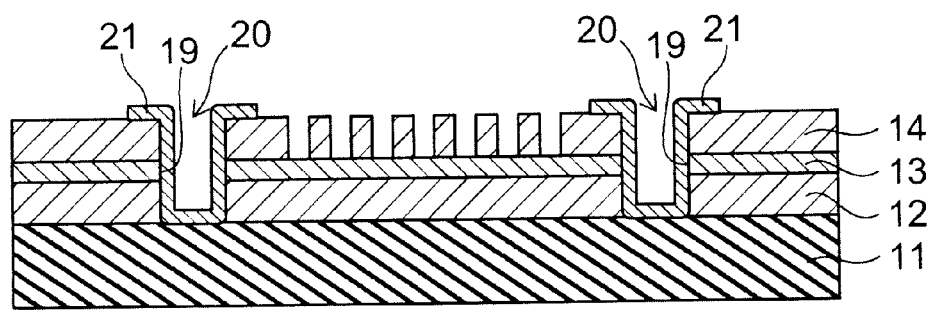

Next, as shown in step S5 of FIG. 6 and FIG. 7D, the pattern defects detected in the first inspection shown in step S3 are repaired. Specifically, black defects are irradiated with a charged particle beam in an etching gas atmosphere to etch away the remaining light absorbing film 14. On the other hand, white defects are irradiated with a charged particle beam in a deposition gas atmosphere to deposit a light absorbing material on the portion lacking the light absorbing film 14. Here, the buffer layer 13 functions as a protective film for protecting the light reflecting film 12 from irradiation with the charged particle beam. This repair of pattern defects is performed illustratively by the electron beam defect repair system, MeRiT, manufactured by Carl Zeiss.

Here, interconnects 21 are formed across the light shielding frame 20 on the substrate 11. This formation of interconnects 21 is performed at the same timing as the repair of pattern defects using the same system as the aforementioned pattern defect repair system. That is, repair of pattern defects and formation of interconnects are continuously performed without extracting the precursor from inside the repair system. For instance, repair of pattern defects may be followed by formation of interconnects 21, formation of interconnects 21 may be followed by repair of pattern defects, or interconnects 21 may be formed during repair of pattern defects. Here, to increase the processing efficiency, it is preferable not to break the vacuum of the repair system during a series of processes including repair of pattern defects and formation of interconnects.

To form interconnects 21, for instance, the region where the interconnects 21 are to be formed is irradiated with an electron beam in a chromium hexacarbonyl ($Cr(CO)_6$) gas atmosphere to deposit chromium (Cr) on this region. The interconnects 21 are formed so that the portion $15_{in}$ of the laminated film 15 located inside the light shielding frame 20 is connected to the portion $15_{out}$ located outside the light shielding frame 20. Three interconnects 21 are formed on each side of the light shielding frame 20. The thickness of each interconnect 21 is illustratively 10 to 100 nm, and more particularly 50 nm. The width of each interconnect 21 is narrower than the minimum width of the pattern 18, and is illustratively 50 nm.

Next, as shown in step S6 of FIG. 6 and FIG. 3, the light absorbing film 14 is used as a mask to etch away the buffer layer 13 from the region outside the immediately underlying region of the light absorbing film 14. Subsequently, the precursor is cleaned.

Next, as shown in step S7 of FIG. 6, a second inspection is performed on the pattern 18. This inspection is the pre-shipment inspection of the exposure mask. This inspection is performed by irradiating the patterning region 17 of the portion $15_{in}$ with an electron beam to obtain an electron image of the pattern 18 while grounding the portion $15_{out}$ through a conductive pin (not shown) in contact therewith, and is performed illustratively by the electron beam projection technique in which the aforementioned electron beam defect inspection system (EBeye-M) is used for planar irradiation with an electron beam. Here, the portion $15_{in}$ irradiated with the electron beam is electrically connected through the interconnects 21 to the portion $15_{out}$ with which the conductive pin (not shown) is in contact. Hence, no charge-up occurs due to electron beam irradiation. This enables accurate inspection without causing the conventional problem of image distortion due to charge-up, and the defect inspection sensitivity can illustratively be maintained at 20 nm. This can ensure detection of foreign matter attached to the pattern 18, such as foreign matter attached in the process of forming a light shielding frame 20 (step S4), the process of repairing pattern defects and forming interconnects 21 (step S5), and the process of etching the buffer layer 13 (step S6) described above.

Next, as shown in step S8, if any foreign matter is detected in the second inspection shown in step S7, the foreign matter is removed. Here, the foreign matter may be collectively removed by wet cleaning, or the foreign matter may be removed on a particle-by-particle basis by pressing an AFM (atomic force microscope) probe laterally against the foreign matter. Thus, an exposure mask 1 free from defects can be manufactured.

Next, the function and effect of this embodiment are described.

According to this embodiment, the interconnects 21 are formed across the light shielding frame 20 in step S5 shown in FIG. 6. Thus, in the second inspection shown in step S7, accurate inspection can be performed by preventing charge-up. Consequently, defects generated in the pattern 18 can be reliably removed in the inspection immediately before shipment of the exposure mask. Thus, an exposure mask 1 free from defects can be obtained.

Furthermore, in this embodiment, formation of interconnects 21 is performed at the same timing and using the same system as repair of pattern defects. Hence, there is no need to provide a dedicated process for forming interconnects 21 and to prepare a dedicated system. Thus, increase in manufacturing cost due to formation of interconnects 21 can be suppressed.

Next, a variation of the second embodiment is described.

Figure 8:
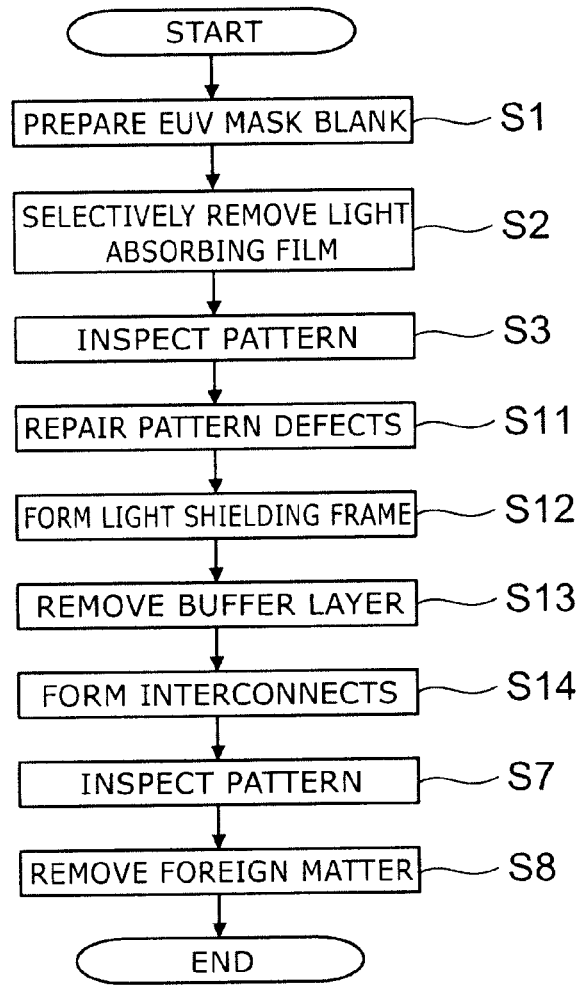
FIG. 8 is a flow chart illustrating a method for manufacturing an exposure mask according to a variation of the second embodiment.

FIG. 8 is a flow chart illustrating the method for manufacturing an exposure mask according to this variation.

Figure 9:
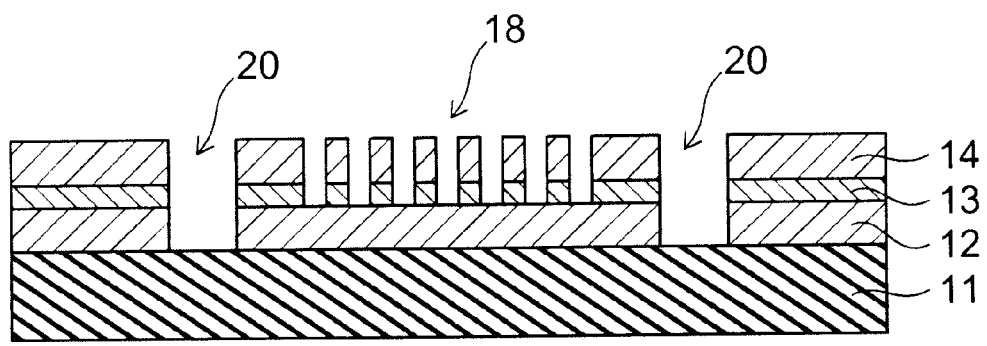
FIG. 9 is a process cross-sectional view illustrating the method for manufacturing an exposure mask according to the variation of the second embodiment.

FIG. 9 is a process cross-sectional view illustrating the method for manufacturing an exposure mask according to this variation.

In this variation, repair of pattern defects and formation of interconnects are performed in separate processes.

First, the process shown in steps S1 to S3 of FIG. 8 is performed. The process shown in steps S1 to S3 of FIG. 8 is the same as the process shown in steps S1 to S3 of FIG. 6. More specifically, like the above second embodiment, an EUV mask blank is prepared (step S1), the light absorbing film 14 is selectively removed to form a pattern 18 (step S2), and a first inspection is performed (step S3). Thus, a precursor shown in FIG. 7B is fabricated.

Next, as shown in step S11 of FIG. 8, repair of pattern defects is performed on the basis of the result of the first inspection (step S3). The method for repairing pattern defects is the same as that in the above second embodiment.

Next, as shown in step S12 of FIG. 8 and FIG. 7C, the laminated film 15 is removed from a frame-shaped region surrounding the patterning region 17 to form a light shielding frame 20. The method for forming the light shielding frame 20 is also the same as that in the above second embodiment.

Next, as shown in step S13 of FIG. 8 and FIG. 9, the patterned light absorbing film 14 is used as a mask to etch away the buffer layer 13 from the region outside the immediately underlying region of the light absorbing film 14. Subsequently, the precursor is cleaned.

Next, as shown in step S14 of FIG. 8 and FIG. 3, interconnects 21 are formed. The method for forming interconnects 21 is also the same as that in the above second embodiment.

The subsequent process is the same as that in the above second embodiment. More specifically, a second inspection is performed as shown in step S7 of FIG. 8, and foreign matter is removed on the basis of the inspection result as shown in step S8. Thus, an exposure mask 1 can be manufactured.

Also in this variation, like the above second embodiment, the interconnects 21 are formed in step S14 shown in FIG. 8, and thus in the second inspection shown in step S7, accurate inspection can be performed by preventing charge-up. Consequently, the exposure mask 1 free from defects can be obtained.

In this variation, it is possible to interchange the sequence of the repair of pattern defects shown in step S11 and the formation of the light shielding frame 20 shown in step S12.

Next, a third embodiment of the invention is described.

This embodiment relates to a method for manufacturing a semiconductor device using the exposure mask according to the above first embodiment.

FIGS. 10A to 10D are process cross-sectional views illustrating the method for manufacturing a semiconductor device according to this embodiment.

Figure 10A:
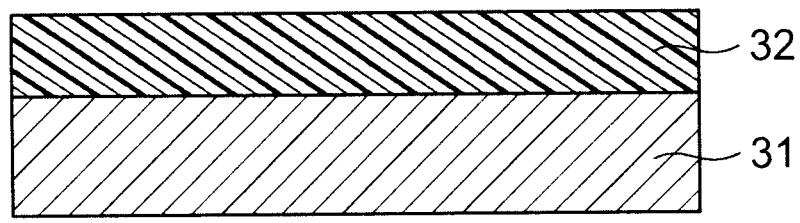
FIGS. 10A to 10D are process cross-sectional views illustrating a method for manufacturing a semiconductor device according to a third embodiment of the invention.

First, as shown in FIG. 10A, a semiconductor substrate 31 is prepared. The semiconductor substrate 31 is illustratively a silicon wafer. Then, a resist film 32 is formed on the semiconductor substrate 31. The resist film 32 is an electron beam resist sensitive to an electron beam.

Figure 10B:
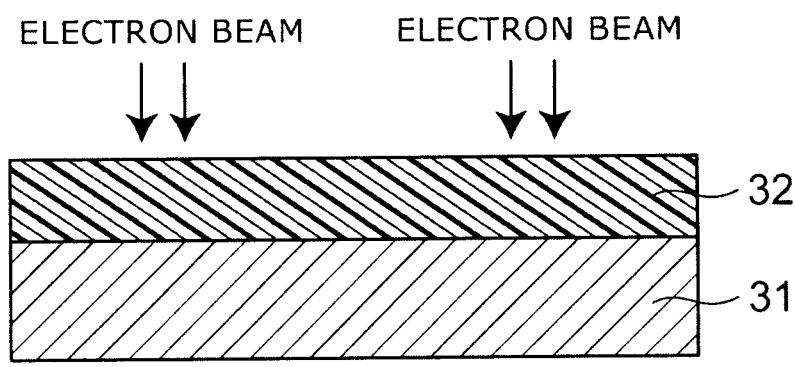

Next, as shown in FIG. 10B, the resist film 32 is exposed using the exposure mask according to the above first embodiment. More specifically, as shown in FIGS. 1 and 3, the exposure mask 1 is irradiated with exposure light, which is EUV laser light having a wavelength of 13.5 nm. Part of the EUV light incident on the exposure mask 1 directly reaches the light reflecting film 12 without passing through the light absorbing film 14 and the buffer layer 13, and is partly reflected by the light reflecting film 12. The reflectance here is e.g. approximately 65%. The light incident on the light absorbing film 14 is partly absorbed by the light absorbing film 14 or the buffer layer 13. The rest of the light is transmitted through the light absorbing film 14 and the buffer layer 13 to the light reflecting film 12, reflected by the light reflecting film 12, and again transmitted through the buffer layer 13 and the light absorbing film 14 with absorption. Thus, the rest of the light is reflected illustratively at a total reflectance of 2-3%. Here, the refractive index of the light absorbing film 14 and the buffer layer 13 is higher than that of air, and the optical path passing through the light absorbing film 14 and the buffer layer 13 has a longer optical length than the optical path passing through air. Hence, the light reflected through the light absorbing film 14 and the buffer layer 13 is approximately 180 degrees out of phase with respect to the light directly reaching the light reflecting film 12 and reflected thereby.

The EUV beam reflected by the exposure mask 1 is converged so as to reduce the beam diameter by a factor of four, for instance, and imaged on the resist film 32. Thus, the resist film 32 is selectively irradiated. Here, the light outgoing from the light absorbing film 14 is approximately 180 degrees out of phase with respect to the light directly reflected by the light reflecting film 12. Hence, a pattern with high contrast can be imaged on the resist film 32.

Here, the portion $15_{out}$ of the laminated film 15 located outside the light shielding frame 20 and the outer peripheral portion of the light shielding frame 20 are shielded by a blind (not shown) provided in the exposure optical system and are not irradiated with EUV light. On the other hand, the inner peripheral portion of the light shielding frame 20 is irradiated with EUV light through an opening of the blind, but the EUV light reaching the light shielding frame 20 is absorbed by the substrate 11 without substantial reflection. Thus, when a certain exposure region of a wafer is exposed to EUV light reflected by the exposure mask 1, no EUV light exits from the outer edge portion of the opening of the blind, and hence an exposure region adjacent to the target exposure region is not irradiated with EUV light. Here, the shape of the opening of the blind can be adapted to the shape of the light shielding frame 20, but positioning of the edge of the opening is accompanied by a mechanical error. However, this error can be absorbed because the width of the light shielding frame 20 is approximately 1 mm.

The interconnect 21 has a width such that the image of the interconnect 21, which is produced by the EUV light reflected by the interconnect 21 and reaching the resist film 32, is smaller than the resolution limit. Thus, the image of the interconnect 21 is not imaged on the resist film 32. Hence, the image of the interconnect 21 is not transferred to the resist film 32.

Figure 10C:
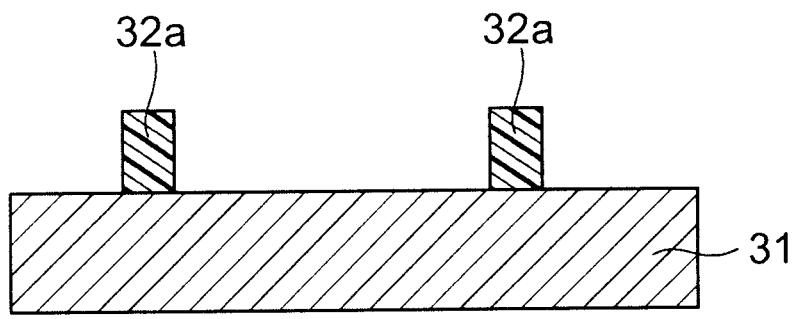

Subsequently, as shown in FIG. 10C, the exposed resist film 32 is developed to form a resist pattern 32a.

Figure 10D:
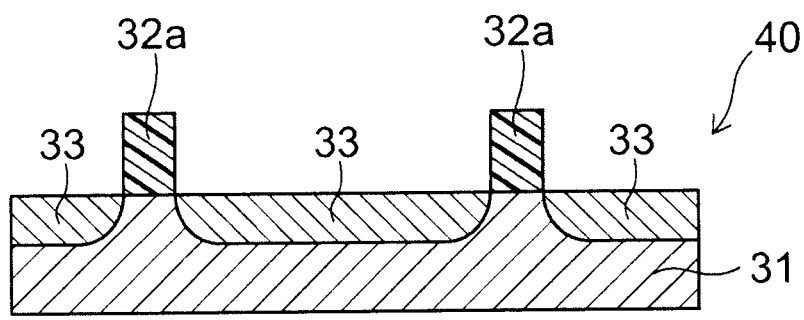

Next, as shown in FIG. 10D, the resist pattern 32a is used as a mask to selectively process the semiconductor substrate. For instance, the resist pattern 32a is used as a mask to implant donor impurities to selectively form an N-type region 33 in an upper portion of the semiconductor substrate 31. Subsequently, conventional processes are suitably performed to manufacture a semiconductor device 40.

According to this embodiment, the exposure mask 1 (see FIG. 1) according to the above first embodiment is used in the process shown in FIG. 10B. As described above, because defects have been removed from this exposure mask, no defect image of the exposure mask is transferred to the semiconductor substrate 31. In the following, this effect is described with reference to a practical example of this embodiment and a comparative example.

Practical Example

A plurality of exposure masks according to the first embodiment were actually manufactured by the method according to the above second embodiment. EUV mask blanks were purchased from HOYA Corp. Here, in the first inspection shown in step S3 of FIGS. 6, 15 to 18 defects were detected per exposure mask. These defects were all black defects with residual light absorbing film. In the process of repairing pattern defects shown in step S5, these black defects were all repaired.

Subsequently, the second inspection was performed in step S7. This inspection was performed by irradiating the patterning region with an electron beam to obtain an electron beam image, and a clear image was successfully obtained without charge-up. As the result of this inspection, five to seven defects were detected per exposure mask. These defects were all attachment of foreign matters. Thus, in step S8, these foreign matters were removed. The exposure mask according to the first embodiment was thus manufactured.

Subsequently, by the method according to this third embodiment, this exposure mask was used for lithography to manufacture a semiconductor device having a half pitch of 24 nm, which was then inspected. As a result, no defect attributable to the exposure mask was detected in the manufactured semiconductor device. Furthermore, no trace of transfer from the interconnect 21 was observed. Thus, the semiconductor device was successfully manufactured with high yield.

Comparative Example

As a comparative example, a plurality of exposure masks with no interconnect 21 formed on the light shielding frame 20 were also manufactured. Here, in the first inspection shown in step S3 of FIGS. 6, 15 to 18 black defects were detected per exposure mask. Hence, in the process of repairing pattern defects shown in step S5, these black defects were all repaired. In this process, no interconnect 21 was formed. Subsequently, the second inspection was performed in step S7. However, charge-up occurred in the patterning region due to electron beam irradiation, and the obtained image was obscured. In this second inspection, no defect was recognized.

Subsequently, by a method similar to the method according to this third embodiment, the exposure mask thus manufactured was used to manufacture a semiconductor device having a half pitch of 24 nm, which was then inspected. As a result, defects attributed to the exposure mask were detected in the manufactured semiconductor device. Presumably, the obscure image obtained in the aforementioned second inspection resulted in low inspection accuracy, and defects of the exposure mask were missed and transferred to the semiconductor device. Thus, in the comparative example, the yield of the semiconductor device was low.

The invention has been described with reference to the embodiments. However, the invention is not limited to these embodiments. More specifically, those skilled in the art can suitably modify the above embodiments by addition, deletion, or design change of components, or by addition, omission, or condition change of processes, and such modifications are also encompassed within the scope of the invention as long as they fall within the spirit of the invention. For instance, the thickness of the interconnect crossing the light shielding frame and the number of such interconnects are not limited to those in the above embodiments, but may be suitably modified.

The invention claimed is:

1. A method for manufacturing a semiconductor device, comprising:
   forming a resist film on a semiconductor substrate;
   exposing the resist film using an exposure mask;
   developing the resist film to form a resist pattern; and
   using the resist pattern as a mask to selectively process the semiconductor substrate,
   the exposure mask including:
      an insulative substrate having a main surface, the main surface including:
         a center region;
         an intermediate region surrounding the center region; and
         an outer region surrounding the intermediate region;
      a light reflecting film provided on the center region and the outer region;
      a light absorbing film provided on the light reflecting film and forming a pattern in the center region; and
      an interconnect provided across the intermediate region and electrically connecting a portion of a laminated film, composed of the light reflecting film and the light absorbing film, located in the center region and a portion of the laminated film located in the outer region, a width of the interconnect being smaller than a minimum width of the pattern,
   wherein the light reflecting film and the light absorbing film are not provided in the intermediate region.

2. The method according to claim 1, wherein the portion of the laminated film located outside the intermediate region and an outer peripheral portion of the intermediate region are shielded from light during the exposing.

3. The method according to claim 1, wherein a width of the interconnect is such that an image of the interconnect is not imaged when exposure light reflected by the interconnect reaches the resist film.

* * * * *